United States Patent [19]

Pauer

[11] Patent Number: 5,025,461
[45] Date of Patent: Jun. 18, 1991

[54] METHOD OF AND CIRCUIT ARRANGEMENT FOR RECOVERING A BIT CLOCK FROM A RECEIVED DIGITAL COMMUNICATION SIGNAL

[75] Inventor: Dieter Pauer, Frieberg, Fed. Rep. of Germany

[73] Assignee: Alcatel N.V., Amsterdam, Netherlands

[21] Appl. No.: 362,802

[22] Filed: Jun. 5, 1989

[30] Foreign Application Priority Data

Jun. 3, 1988 [DE] Fed. Rep. of Germany ....... 3818843

[51] Int. Cl.[5] ............................................. H04L 7/033
[52] U.S. Cl. ....................................... 375/119; 377/52
[58] Field of Search ................. 375/95, 106, 118, 119; 328/72, 74, 155, 109; 377/47, 52; 370/105.3

[56] References Cited

U.S. PATENT DOCUMENTS

| 3,668,315 | 6/1972 | Heitzman | 375/119 |
| 3,697,689 | 10/1972 | Gibson | 375/119 |
| 4,546,394 | 10/1985 | Yamamoto | 375/95 |
| 4,896,337 | 1/1990 | Bushy, Jr. | 375/118 |

FOREIGN PATENT DOCUMENTS 0202597 11/1986 European Pat. Off. .
2354103 5/1975 Fed. Rep. of Germany .
24356875 2/1976 Fed. Rep. of Germany .
2935353 3/1981 Fed. Rep. of Germany .

Primary Examiner—Benedict V. Safourek
Attorney, Agent, or Firm—Christie, Parker & Hale

[57] ABSTRACT

A local bit clock having the frequency of the signal to be received is generated at the receiving end by means of a clock generator (TG) and a counter (Z). A phase evaluation logic (PAL) evaluates the time position of the leading edge of a received pulse in comparison with a predetermined time position of the effective pulse edge of the local bit clock. In the synchronous case, the effective pulse edge is located at the center of the received pulse (center-of-bit sampling). Because of nonideal line properties, the duration of the received pulses may differ from the desired value. To be able to distinguish a momentary edge drift of a received pulse (pulse too short or too long) from an actual phase shift, the time positions of the leading and trailing edges of each pulse are determined. If a pulse is too short or too long but symmetrical with respect to the predetermined time position of the effective pulse edge of the local bit clock, this indicates a momentary edge drift, so that no phase correction is necessary.

5 Claims, 4 Drawing Sheets

| LEADING EDGE | 0 | 1 | 2 | 3 | 4 | 5 | 6 | 7 |
|---|---|---|---|---|---|---|---|---|
| SR: Q1 = 1 ; Q2 = 0 | 2 | 3 | 4 | 5 | 6 | 7 | 0 | 1 |
| FFU | 0 | 0 | 0 | 1 | 1 | 1 | 1 | 0 |
| FFD | 1 | 1 | 0 | 0 | 0 | 0 | 1 | 1 |

| TRAILING EDGE | 0 | 1 | 2 | 3 | 4 | 5 | 6 | 7 |
|---|---|---|---|---|---|---|---|---|
| SR: Q1 = 0 ; Q2 = 1 | 2 | 3 | 4 | 5 | 6 | 7 | 0 | 1 |
| FFU | 1 | 1 | x | $\overline{1}$ | $\overline{1}$ | $\overline{1}$ | x | x |
| FFD | $\overline{1}$ | $\overline{1}$ | x | 1 | 1 | x | x | $\overline{1}$ | x = DON'T CARE (NO CHANGE)
$\overline{1}$ = RESET

METHOD OF AND CIRCUIT ARRANGEMENT FOR RECOVERING A BIT CLOCK FROM A RECEIVED DIGITAL COMMUNICATION SIGNAL

TECHNICAL FIELD

The present invention relates to a method of and a circuit arrangement for recovering a bit clock from a received digital communication signal.

CLAIM FOR PRIORITY

This application is based on and claims priority from an application first filed in Fed. Rep. Germany on 3 June 1988 under Ser. No. P38 18 843.0. To the extent such prior application may contain any additional information that might be of any assistance in the use and understanding of the invention claimed herein, it is hereby incorporated by reference.

BACKGROUND ART

In the prior art bit clock recovery circuit disclosed in published West German Patent Application AS 24 35 687 a clock generator at the receiving end generates a reference clock whose frequency is N times the frequency of the bit clock, a counter operating as a frequency divider and having at least N count states is cyclically incremented by the reference clock so as to divide the reference clock to the frequency of the bit clock, which is delivered at one of its outputs, the period of the bit clock is divided into N equal portions of time, and the effective pulse edge of the bit clock provided at the output of the counter occurs at the count determined by N/2.

The frequency of the clock generator is n times the frequency of the received bit clock, and the counter is controlled by the logic circuit and synchronously with the pulses from the clock generator in such a way as to be incremented either not at all or by one or two counts depending on the deviation from the desired position. In the synchronous case, an effective pulse edge of the bit clock occurs at the center of each bit unit of the received signal.

Such prior art circuits generate a bit-clock signal whose phase is derived from the beginning, i.e., a leading edge, of a received pulse of the communication signal. Because of the commonly used transmission codes (e.g., HDB3, AMI) and the nonideal characteristics of the transmission lines, the duration of the received pulses may differ from the desired value.

This means that the leading edge of the received pulse of a bit sequence occurs earlier or later, which inevitably leads to continuous phase corrections that counteract a frequency drift for a short time and may thus lead to a higher bit-error rate.

DISCLOSURE OF INVENTION

It is the object of the invention to provide a method and a circuit arrangement whereby a phase-locked bit clock can be recovered from a received digital communication signal, so that even if pulses with different durations are received, the effective pulse edge of the local bit clock will lie as close in time to the center of the actually received pulse as possible.

Since, according to the invention, the time positions, i.e., the counts for the leading edge and the trailing edge of a received pulse are determined, the actual duration of the received pulse can be ascertained. This makes it possible to distinguish between a genuine phase shift and an only momentary edge drift due to pulse durations which are shorter or longer than the desired duration. If, for example, the duration of a pulse is too long and the effective pulse edge of the bit clock occurring at the count N/2 nevertheless lies at the center of the received pulse, this indicates a momentary edge drift, but, according to the invention, no phase correction will take place.

BRIEF DESCRIPTION OF DRAWINGS

An embodiment of the invention will now be explained with reference to the accompanying drawings, in which:

FIG. 4 is a truth table for the phase evaluation logic in accordance with the invention.

BEST MODE FOR CARRYING OUT THE INVENTION

Figure 1:
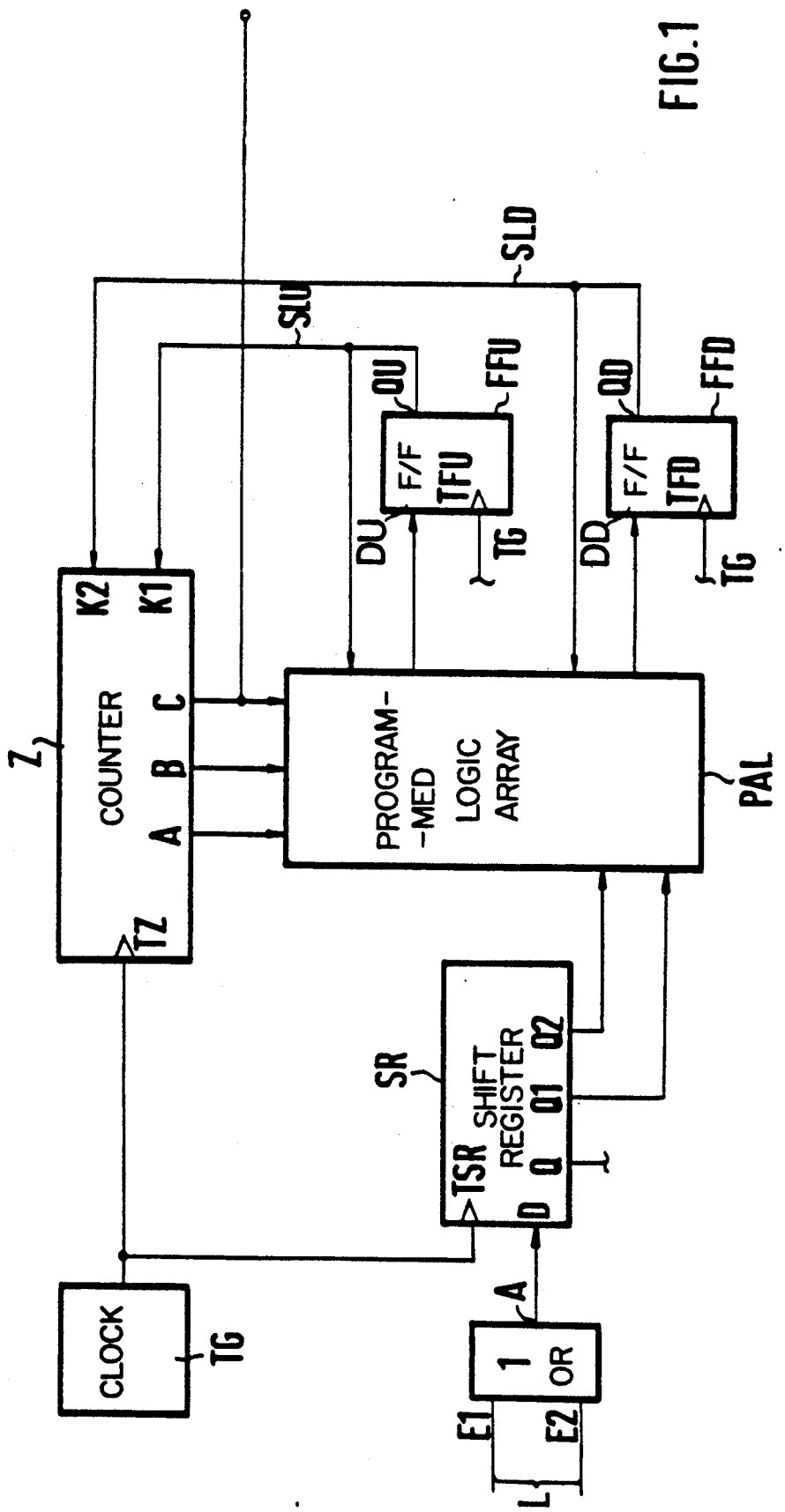
FIG. 1 is a block diagram of a circuit arrangement in accordance with the invention.

First, the circuit arrangement according to the invention will be described with the aid of FIG. 1.

The circuit includes a clock generator TG, which generates a reference clock whose frequency is N times the frequency of the received clock. In the example being described, the frequency of the reference clock is 16.384 MHz, and the factor N is 8, so that the frequency of the bit clock is 2.048 MHz. The clock generator TG can be implemented with a conventional TTL crystal oscillator.

The clock generator TG is connected to a clock input TZ of a counter Z having at least N count states, here 8 count states. Accordingly, the counter has three outputs A, B, C, which are connected to a phase evaluation logic PAL, with a frequency of 2.048 MHz, which is equal to the frequency of the bit clock, being obtainable from the output C.

Also connected to the phase evaluation logic PAL is a receive line L, over which the digital communication signal to be received is transmitted.

It will be assumed that the signal is transmitted in the HDB3 code. The incoming positive pulses are applied to a first input E1 of a logic OR gate OR, and the incoming negative pulses to a second input E2. An output A of the OR gate OR is connected to a signal input D of a serial-parallel shift register SR.

A clock input TSR of the shift register SR is connected to the clock generator TG. A first output Q1 and a second output Q2 of the shift register SR are connected to the phase evaluation logic PAL.

Because of the received a synchronous communication signal applied to the signal input D of the shift register SR, it may happen that the setup and hold times commonly required for such logic elements cannot be met, so that short-time undefined states may occur at the output Q of the first stage of the shift register SR. To avoid such errors, use is made of a three-stage shift register SR in which the output Q of the first stage is not wired. Thus, the first output Q1 and the second output Q2, which are connected to the phase evaluation logic PAL, represent the outputs of the second and third shift-register stages, respectively (cf. FIG. 4).

The phase evaluation logic PAL is connected to a first flip-flop FFU for temporarily storing a correction signal for inserting an additional count pulse, henceforth designated UP, and to a second flip-flop FFD for temporarily storing a correction signal for suppressing a count pulse from the counter, henceforth designated DOWN. The two flip-flops are designed here as D flip-flops, with a signal output QU of the first flip-flop FFU connected by a first control line SLU to a first correction input K1 of the counter Z, and a signal output QD of the second flip-flop FFD connected by a second control line SLD to a second correction input Q2 of the counter Z. In addition, the two signal outputs QU, QD are fed back to the phase evaluation logic PAL.

The method according to the invention will now be explained with reference to the timing diagrams of FIGS. 2 and 3 in connection with the circuit arrangement of FIG. 1.

Figure 2:
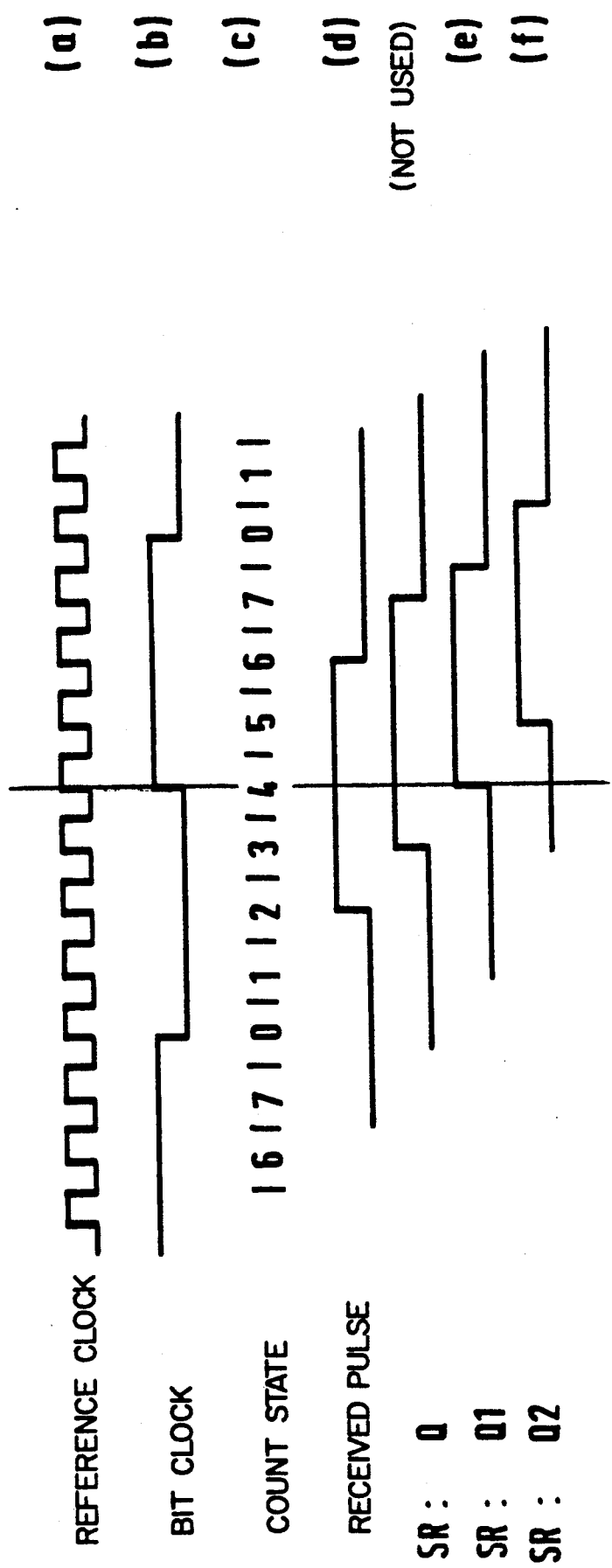
FIG. 2 is a first timing diagram serving to explain the method in accordance with the invention.

In FIG. 2, line a shows the waveform of the 16.384-MHz reference clock generated by the clock generator TG. Line b shows the waveform of the reference clock divided by a factor of $N=8$ by the counter Z, i.e., the bit clock with a frequency of 2.048 MHz. Since the counter Z has $N=8$ count states, which appear at its three outputs A, B, C, cf. FIG. 1 (three outputs $=2^3=8$ count states), the period T of the bit clock, as shown in line c of FIG. 2, is divided into $N=8$ equal portions of time which represent the 8 count states.

A pulse sequence incoming on the receive line L is first applied to the signal input D of the shift register SR. Line d of FIG. 2 shows a received pulse, and lines e and f show the pulses at the first output Q1 and the second output Q2, respectively, which were delayed by the shift register SR.

The bit combinations at the two outputs Q1, Q2 of the shift register SR, which is clocked by the reference clock, are as follows:

| Q1 | Q2 | |
|---|---|---|
| 0 | 0 | = no pulse |
| 1 | 0 | = leading edge of the pulse |
| 0 | 1 | = trailing edge of the pulse |
| 1 | 1 | = pulse present |

In the absence of a pulse, cf. lines e and f and count 1 or 2 in line c, the two outputs Q1, Q2 of the shift register SR will provide a logic 0 to the phase evaluation logic PAL. If the leading edge of a pulse arrives, the output Q1 will be a logic 1 and the output Q2 a logic 0. As long as the received pulse is being shifted through the shift register, the two outputs Q1, Q2 are at logic 1 (data pulse present). A trailing pulse edge, cf. lines e and f and count 0 or 1 in line c, then signifies that the output Q2 (line f) is still at logic 1 while the output Q1 has already changed to logic 0. These four different bit combinations are continuously communicated to the phase evaluation logic PAL at the pulse repetition rate of the reference clock.

From the counts made available via the three outputs A, B, C of the counter Z, cf. line c, and the bit combinations transferred synchronously therewith via the two outputs Q1, Q2 of the shift register SR, the phase evaluation logic PAL determines the counts at which the leading edge and the trailing edge of each received pulse of the communication signal occur.

Figure 3:
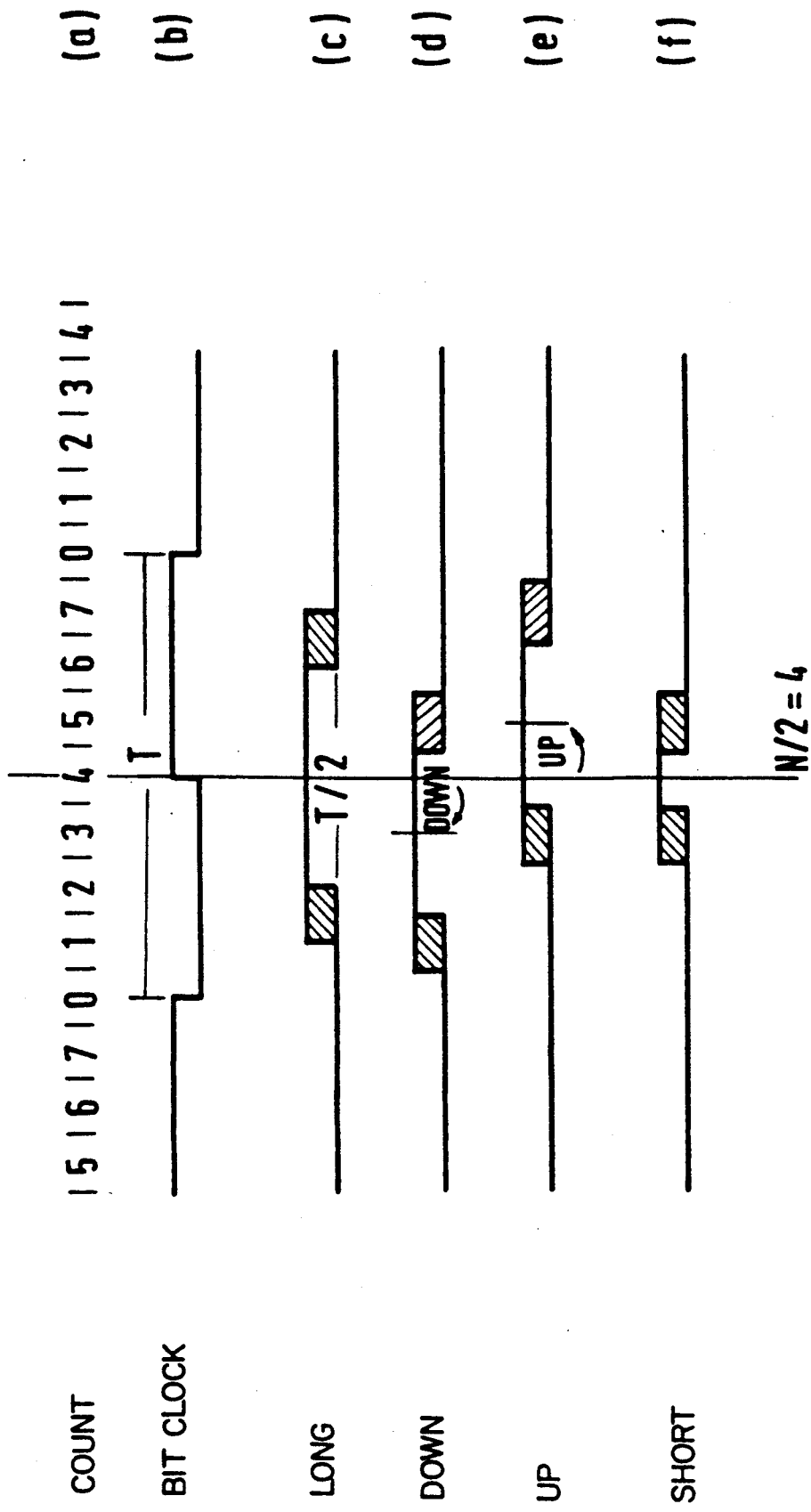
FIG. 3 is a second timing diagram serving to explain the method in accordance with the invention.

In FIG. 3, line a shows the counts of the counter Z (see also FIG. 2, line c), which divide the period T of the bit clock, line b in FIG. 3, into 8 equal portions of time.

The effective pulse edge of the local bit clock, FIG. 3, line b, is located at the count determined by $N/2=4$ (so-called center-of-bit sampling); this is illustrated by the solid vertical line in FIG. 3.

The phase evaluation logic PAL sends a correction signal to the counter Z over the first or second control line SLU, SLD only if, irrespective of the duration of a received pulse, the pulse edge of the local bit clock is not located at the center of the received pulse of the communication signal (will be explained in detail below).

In the following, different cases characterizing the invention will be disclosed with the aid of the truth table for the phase evaluation logic shown in FIG. 4.

The two-part truth table shows in the first line of the upper half the 8 counts applied to the phase evaluation logic PAL via the three outputs A, B, C. The second line shows the bit combination 10 (leading pulse edge) at the two outputs Q1, Q2 of the shift register SR at the respective counts shifted by two counts with respect to line a. In the third line, designated FFU, a 1 has been entered if at the count entered in line two corresponding to $(Q_1, Q_2)=(1, 0)$, the received pulse is a leading received pulse. Similarly, a 1 has been entered in the fourth line, designated FFD, if at the count entered in line two corresponding to $(Q_1, Q_2) =(1, 0)$, the received pulse is a lagging received pulse.

The upper half of the truth table thus corresponds to "count state at a leading edge of the received pulse relative to the count state for the effective pulse edge of the bit clock, characterized by $N/2=4$".

Assume, for example, cf. FIG. 3, line c, that a leading edge of a received pulse is determined at a count of 1, cf. FIG. 4, line a. Assuming that a pulse to be received has a desired duration of T/2, the pulse edge detected at count 1 occurs one count too early in relation to the count $N/2=4$, hereinafter referred to as "sampling count". As a result, a correction signal DOWN is stored in the second flip-flop FFD (cf. FIG. 4, fourth line, entry "1"). If the trailing edge of a received pulse, cf. FIG. 3, line c, and FIG. 4, lower half of the table, second line Q1=0, Q2=1, is determined at count 7, cf. FIG. 4, lower half, first line, the received pulse is a pulse whose duration differs from the desired duration T/2 (by 2 counts), but which is symmetrical with respect to the sampling count. However, since this extended pulse is sampled at the center with respect to the sampling count, according to the invention, no correction signal is required, so that the correction signal DOWN stored in the second flip-flop FFD is reset, cf. FIG. 4, lower half of the table, fourth line, entry 1̄. The entry 1̄ in the truth table signifies that any previously stored correction signal DOWN (or UP) is reset too.

If the leading edge of a received pulse occurs at count 3, cf. FIG. 3, line f, and FIG. 4, upper half, first line, and the associated trailing pulse edge at count 5, cf. FIG. 4, lower half, first line, the received pulse is a pulse whose duration is shorter than the desired duration T/2, but which is again symmetrical with respect to the sampling count $N/2$. In response to the leading pulse edge at count 3, a correction signal UP is stored in the first flip-flop FFU, cf. FIG. 4, upper half, entry 1 in the third line. As the phase evaluation logic PAL has determined that the pulse is "only" a shortened but correctly sampled pulse, the correction signal UP stored in the first flip-flop FFU is reset, cf. FIG. 4, lower half, third line, entry 1below count 5 of the first line.

In the two previously described cases, cf. FIG. 3, lines c and f, according to the invention, no phase corrections are performed since the actual duration of the received pulse can be derived from the determination of the leading and trailing pulse edges, and since no corrections are necessary for pulses that are symmetrical with respect to the sampling count.

If the leading pulse edge occurs at count 1, cf. FIG. 3, line d, and FIG. 4, upper half, first and fourth lines, and the trailing pulse edge at count 5, this indicates an actual phase shift (lagging) since the pulse is unsymmetrical with respect to the sampling count 4.

As can be seen in FIG. 4, upper half, fourth line, a correction signal DOWN is stored in the second flip-flop FFD and sent over the second control line SLD to the second correction input K2 of the counter Z (cf. FIG. 4, lower half, fourth line, entry X=don't care, i.e., no reset). The correction signal DOWN causes a count pulse of the counter Z to be suppressed.

If the leading pulse edge occurs at count 3 and the trailing pulse edge at count 7, cf. FIG. 3, line e, and FIG. 4, first and third lines, this indicates an actual phase shift (leading). A correction is now performed by storing a correction signal UP in the first flip-flop FFU. The correction signal UP is applied over the first control line SLU to the first correction input K1 of the counter Z and causes an additional count pulse to be inserted. Thus the second half of the truth table uses the count state at which the trailing edge is detected not only to set the UP or DOWN flag when the trailing edge of the received pulse is more than two counts late or early, respectively (and thus the pulse is at least one count late or early even if the leading edge is on time) but also to reset ("1") a previously set UP (or DOWN) flag when the pulse although centered, is sufficiently short (or long) that its leading edge is late or early, respectively.

The entire circuit arrangement according to the invention can be implemented with a crystal oscillator for the clock generator TG and a programmable logic array. It thus takes up only little space, is inexpensive, and requires no discrete components.

I claim:

1. Method of recovering a bit clock signal from pulses of a digital communication signal received at a receiving end of a transmission path, said method comprising the steps:
   generating a reference clock at the receiving end whose frequency is N times a nominal frequency of the bit clock,
   using the reference clock to cyclically increment a counter having at least N count states so as to divide the reference clock down to the frequency of the bit clock, such that an output of the counter provides an effective pulse edge of the bit clock signal at count state N/2,
   using a phase evaluation logic circuit to determine a first count state of said counter at which a leading edge and a s second count state of said counter at which a trailing edge of each received pulse of the communication signal respectively occur,
   determining a respective center count state of said counter corresponding to said each received pulse, said center count state being equal to the average of said first and second count states, and
   for said each received pulse, delivering a phase correction signal to the counter only if the thus determined center count state is not equal to said count state N/2.

2. A method as claimed in claim 1, wherein
   N is an even integer, and
   no said phase correction signal is delivered in response to a received pulse whose said first and second count states are symmetrically disposed with respect to the count state N/2, even though its duration may be different from a desired pulse duration.

3. A method as claimed in claim 2, wherein if the center count state is found to lead or lag the count state N/2 by at least one count of said counter, the phase correction signal causes the counter to insert one count state in addition to said N count states, or to suppress one of said N count states, respectively.

4. Apparatus for recovering a bit clock signal from pulses of a digital communication signal and for correcting the phase of the recovered clock if the received pulses are not symmetrically disposed about the effective pulse edge of the recovered clock, said apparatus comprising:
   a clock generator circuit;
   a phase evaluation logic circuit for determining whether the received pulses are symmetrically disposed about the effective pulse edge of the recovered bit clock, and if not so symmetrically disposed, for outputting first or second correction signals indicating that the center of the received pulse leads or lags the recovered bit clock respectively;
   a counter operating as a frequency divider and having at least N count states, a clock input connected to the clock generator, a first correction input for causing the counter to assume more than N count states, a second correction input for causing the counter to assume less than N count states, and a plurality of counter outputs representative of the counter's current count state and coupled to a respective plurality of inputs of the phase evaluation logic, the most significant bit of said counter outputs representing the effective pulse edge of the recovered clock;
   a two-stage serial-parallel shift register having a clock input connected to the clock generator, a serial input coupled a receive line, and two parallel outputs coupled to two respective further inputs of the phase evaluation logic;
   first latch means coupled between said phase evaluation logic circuit and said first correction input for temporarily storing said first corrections signal output by the phase evaluation logic; and
   second latch means coupled between said phase evaluation logic circuit and said second correction input for temporarily storing said second correction signal output by the phase evaluation logic.

5. Apparatus as claimed in claim 4, wherein
   the first and second latch means are D flip-flops,
   the phase evaluation logic circuit is implemented as a programmed logic array, and
   the first and second correction signals output by the flip-flops are fed back to the phase evaluation logic circuit.

* * * * *